(12) United States Patent
Wang et al.

(10) Patent No.: US 8,101,500 B2
(45) Date of Patent: Jan. 24, 2012

(54) SEMICONDUCTOR DEVICE WITH (110)-ORIENTED SILICON

(75) Inventors: Qi Wang, Sandy, UT (US); Minhua Li, Sandy, UT (US); Yuri Sokolov, Sandy, UT (US)

(73) Assignee: Fairchild Semiconductor Corporation, So. Portland, ME (US)

( * ) Notice: Subject to any disclaimer, the term of this patent is extended or adjusted under 35 U.S.C. 154(b) by 843 days.

(21) Appl. No.: 12/174,030

(22) Filed: Jul. 16, 2008

(65) Prior Publication Data

US 2009/0179259 A1 Jul. 16, 2009

Related U.S. Application Data

(60) Provisional application No. 60/975,739, filed on Sep. 27, 2007.

(51) Int. Cl.
*H01L 21/30* (2006.01)
(52) U.S. Cl. ......... 438/458; 438/212; 438/455; 438/517
(58) Field of Classification Search .................. 438/156, 438/173, 212, 455, 458, 459, 517, 522
See application file for complete search history.

(56) References Cited

U.S. PATENT DOCUMENTS

| | | |
|---|---|---|
| 4,616,408 A | 10/1986 | Lloyd |
| 5,344,524 A | 9/1994 | Sharma et al. |
| 5,374,564 A | 12/1994 | Bruel |
| 5,391,257 A | 2/1995 | Sullivan et al. |
| 5,455,202 A | 10/1995 | Malloy et al. |
| 5,494,835 A | 2/1996 | Bruel |
| 5,528,058 A | 6/1996 | Pike et al. |
| 5,714,395 A | 2/1998 | Bruel |
| 5,811,348 A | 9/1998 | Matsushita et al. |
| 5,877,070 A | 3/1999 | Goesele et al. |

(Continued)

FOREIGN PATENT DOCUMENTS

WO   WO 2006/058210 A1   6/2006

OTHER PUBLICATIONS

International Search Report and Written Opinion of PCT Application No. PCT/US08/77240, date of mailing Dec. 12, 2008, 12 pages total.

(Continued)

*Primary Examiner* — Kevin M Picardat
(74) *Attorney, Agent, or Firm* — Kilpatrick Townsend & Stockton LLP

(57) ABSTRACT

A method of forming a semiconductor device on a heavily doped P-type (110) semiconductor layer over a metal substrate includes providing a first support substrate and forming a P-type heavily doped (110) silicon layer overlying the first support substrate. At least a top layer of the first support substrate is removable by a selective etching process with respect to the P-type heavily doped (110) silicon layer. A vertical semiconductor device structure is formed in and over the (110) silicon layer. The vertical device structure includes a top metal layer and is characterized by a current conduction in a <110> direction. The method includes bonding a second support substrate to the top metal layer and removing the first support substrate using a mechanical grinding and a selective etching process to expose a surface of the P-type heavily doped (110) silicon layer and to allow a metal layer to be formed on the surface.

12 Claims, 10 Drawing Sheets

U.S. PATENT DOCUMENTS

| | | | |
|---|---|---|---|
| 5,882,987 | A | 3/1999 | Srikrishnan |
| 5,998,833 | A | 12/1999 | Baliga |
| 6,033,489 | A | 3/2000 | Marchant et al. |
| 6,140,210 | A | 10/2000 | Aga et al. |
| 6,372,608 | B1 | 4/2002 | Shimoda et al. |
| 6,391,744 | B1 | 5/2002 | Hudak et al. |
| 6,392,290 | B1 | 5/2002 | Kasem et al. |
| 6,429,481 | B1 | 8/2002 | Mo et al. |
| 6,455,398 | B1 | 9/2002 | Fonstad et al. |
| 6,468,923 | B1 | 10/2002 | Yonehara et al. |
| 6,500,732 | B1 | 12/2002 | Henley et al. |
| 6,562,647 | B2 | 5/2003 | Zandman et al. |
| 6,635,534 | B2 | 10/2003 | Madson |
| 6,713,813 | B2 | 3/2004 | Marchant |
| 6,828,195 | B2 | 12/2004 | Mo et al. |
| 6,939,781 | B2 | 9/2005 | Redd et al. |
| 7,033,891 | B2 | 4/2006 | Wilson et al. |
| 7,052,974 | B2 | 5/2006 | Mitani et al. |
| 7,635,637 | B2 * | 12/2009 | Wang et al. .................. 438/458 |
| 2002/0142548 | A1 | 10/2002 | Takaishi |
| 2003/0183876 | A1 | 10/2003 | Takafuji et al. |
| 2004/0036121 | A1 | 2/2004 | Aoki et al. |
| 2004/0140479 | A1 | 7/2004 | Akatsu |
| 2005/0017291 | A1 | 1/2005 | Hirler |
| 2005/0167742 | A1 | 8/2005 | Challa et al. |
| 2006/0108635 | A1 | 5/2006 | Bhalla et al. |
| 2006/0058210 | A1 | 6/2006 | Challa et al. |
| 2006/0214222 | A1 | 9/2006 | Challa et al. |
| 2006/0273386 | A1 | 12/2006 | Yilmaz et al. |
| 2007/0020884 | A1 | 1/2007 | Wang et al. |
| 2007/0032020 | A1 | 2/2007 | Grebs et al. |
| 2007/0190728 | A1 | 8/2007 | Sreekantham et al. |
| 2007/0262360 | A1 | 11/2007 | Pattanayak et al. |
| 2008/0261379 | A1 | 10/2008 | Jinbo et al. |
| 2009/0179259 | A1 | 7/2009 | Wang et al. |

OTHER PUBLICATIONS

International Search Report and Written Opinion corresponding to the PCT application No. PCT/US06/28270, date of mailing Jun. 13, 2007, 11 pages total.

Bruel, M., "Silicon on Insulator Material Technology", *Electronics Letters*, Jul. 6, 1995, vol. 31, No. 14, pp. 1201-1202.

Celler, C.K. et al., "Frontiers of silicon-on-insulator", *Journal of Applied Physics*, vol. 93, No. 9, pp. 4955-4978.

Green, M. L., "Nucleation and growth of atomic layer deposited $HfO_2$ gate dielectric layers on chemical oxide (Si-O-H) and thermal oxide ($SiO_2$ or Si-O-N) underlayers", *Journal of Applied Physics*, vol. 92, No. 12, Dec. 12, 2002, pp. 7168-7174.

Tong, Q.Y. et al., "Layer splitting process in hydrogen-implanted Si, Ge, SiC, and diamond substrates", Mar. 17, 1997, *Appl. Phys. Lett.*, vol. 70, No. 11, pp. 1390-1392.

Tong, Q.Y. et al., "Layer Transfer by Bonding and Layer Splitting", 1999, *Semiconductor Wafer Bonding: Science and Technology*, John Wiley & Sons, Inc., pp. 161-165.

Office Action for U.S. Appl. No. 11/189,163, dated Dec. 12, 2006.
Office Action for U.S. Appl. No. 11/189,163, dated Aug. 21, 2007.
Office Action for U.S. Appl. No. 11/189,163, dated Apr. 30, 2008.
Office Action for U.S. Appl. No. 11/189,163, dated Feb. 5, 2009.
Notice of Allowance for U.S. Appl. No. 11/189,163, dated Aug. 7, 2009.
Office Action for U.S. Appl. No. 12/207,417, dated Nov. 23, 2010.
Notice of Allowance for U.S. Appl. No. 12/207,417, dated Mar. 7, 2011.
Supplemental Notice of Allowance for U.S. Appl. No. 12/207,417, dated Jun. 13, 2011.
Office Action for U.S. Appl. No. 12/614,824 dated Oct. 13, 2010.
Office Action for U.S. Appl. No. 12/614,824, dated Mar. 31, 2011.
First Office Action received from the State Intellectual Property Office of the People's Republic of China for Application No. 200880103707.8, dated Feb. 10, 2011, 33 pages total.
Irie et al., "In-Plane Mobility Anisotrophy and Universality Undeer Uni-axial Strains in n- and p- MOS Inversion Layers on (100), (110), and (111) Si," *IEEE*, pp. 9.5.1 to 9.5.4 (2004).
Sze, S.M., eds. *Physics of Semiconductor Devices*, $2^{nd}$ Edition, pp. 380-390, John Wiley and Sons, New York, 1981.

* cited by examiner

SEMICONDUCTOR DEVICE WITH (110)-ORIENTED SILICON

CROSS-REFERENCES TO RELATED APPLICATIONS

This application claims the benefit of U.S. Provisional Application No. 60/975,739, filed Sep. 27, 2007, commonly assigned, which is incorporated herein by reference in its entirety for all purposes.

BACKGROUND OF THE INVENTION

The present invention relates in general to semiconductor devices, and more particularly to a method and structure for making trench FETs in (110)-oriented silicon.

Conventional semiconductor manufacturing utilizes a number of processes to form semiconductor structures on substrates. In certain devices, the substrate is used as part of the current conduction path. For example, the substrate plays an important role with the solid state switch which is a key semiconductor structure used for discrete device applications and integrated circuits. Solid state switches include, for example, the power metal-oxide-semiconductor field effect transistor (power MOSFET), the insulated-gate bipolar transistor (IGBT), and various types of thyristors. Some of the defining performance characteristics for the power switch are its on-resistance (i.e., drain-to-source on-resistance, $R_{DSon}$), breakdown voltage, and switching speed.

Generally, the switching speed, on-resistance, breakdown voltage, and power dissipation of a typical MOSFET are influenced by the layout, dimensions, and materials. Industry design practice has sought to keep the on-resistance of the MOSFET as low as possible to lower conducting power loss and increase current densities. For example, in vertical power MOSFETs, the on-resistance is composed of several resistances such as channel resistance, drift region (e.g., epitaxial layer) resistance, and substrate resistance. The on-resistance of such a vertical power MOSFET (as well as other MOSFETs) is directly influenced by the type and dimensions of materials used to form the drain to source conduction path. Therefore, for a vertical power devices, such as a power MOSFET, the substrate is a critical performance element.

Even though conventional techniques have been used for making vertical power devices utilizing various substrate materials, there are limitations associated with these conventional techniques. Some of these limitations are discussed in detail below.

Thus, there is a need for improved techniques for making vertical devices having desirable substrate properties while maintaining a simple manufacturing process.

BRIEF SUMMARY OF THE INVENTION

In accordance with embodiments of the invention, various techniques are described for combining higher hole mobility in the (110) P-type material and low resistivity of heavily doped (110) P-type material to improve device properties of P-type vertical semiconductor devices.

According to an embodiment of the invention, a method is provided for forming a semiconductor device on a heavily doped P-type (110) semiconductor layer. The method includes providing a first P-type semiconductor layer, which is characterized by a surface crystal orientation of (110) and a first conductivity, and is heavily doped. The method also includes forming a second P-type semiconductor layer overlying the first P-type semiconductor layer. The second P-type semiconductor layer has a surface crystal orientation of (110) and is characterized by a lower conductivity than the first conductivity. The method further includes forming a top conductor layer overlying the second P-type semiconductor layer, and forming a bottom conductor layer underlying the first P-type semiconductor layer. A current conduction from the top conductor layer to the bottom conductor layer and through the second p-type semiconductor layer is characterized by a hole mobility along a <110> crystalline orientation and on a (110) crystalline plane.

In one specific embodiment, the method includes providing a first support substrate and forming a P-type heavily doped (110) silicon layer overlying the first support substrate. At least a top layer of the first support substrate is removable by a selective etching process with respect to the P-type heavily doped (110) silicon layer. Then a vertical semiconductor device structure is formed in and over the P-type heavily doped (110) silicon layer. The device structure includes a top metal layer and is characterized by a current conduction on a (110) plane and in a <110> direction. The method includes bonding a second support substrate to the top metal layer and removing the first support substrate using a selective etching process to expose a surface of the P-type heavily doped (110) silicon layer. The method also includes providing a metal layer in contact with the surface of P-type heavily doped (110) silicon layer and removing the second support substrate.

In one embodiment, the first support substrate includes an oxide layer overlying a silicon substrate, which is characterized by (100) crystalline orientation, P-type conductivity, and light doping. In a specific embodiment, the P-type heavily doped (110) silicon layer is formed as follows. A P-type heavily doped (110) silicon layer is formed overlying a first silicon substrate which is a lightly doped P-type (110) substrate. A first oxide layer is formed overlying the P-type heavily doped (110) silicon layer. Hydrogen ions are implanted into the heavily doped (110) silicon layer to form a region therein sufficiently weakened by the hydrogen to allow cleaving the heavily doped (110) silicon layer along the region to form an upper (110) layer and a lower (110) layer. In an embodiment, a second oxide layer is formed overlying the first support silicon substrate. The method includes bonding the first substrate to the first support silicon substrate and cleaving the P-type heavily doped (110) silicon layer along the region leaving the lower layer bonded to the second silicon dioxide layer overlying the first support silicon substrate. The lower (110) layer is characterized by P-type conductivity and heavy doping. In a specific embodiment, the first support substrate is removed by grinding the silicon substrate, etching the remaining silicon substrate using the oxide layer as an etch stop, and etching the oxide layer using the P-type heavily doped (110) silicon layer as an etch stop.

In another embodiment, the first support substrate includes a silicon substrate characterized by (110) crystalline orientation, P-type conductivity, and light doping, and the P-type heavily doped (110) silicon layer is formed using an epitaxial process or an ion implantation process. In a specific embodiment, the first support substrate is removed by grinding the silicon substrate and etching the remaining silicon substrate using the heavily doped P-type silicon as a etch stop. For example, the first support silicon substrate can be removed using a wet etching process including KOH or EDP.

In accordance with another embodiment of the invention, a vertical semiconductor device includes a bottom conductive layer and a first P-type semiconductor layer overlying the bottom conductor layer. The first P-type semiconductor layer is heavily doped and is characterized by a surface crystal orientation of (110) and a first conductivity. The vertical semiconductor device includes a second P-type semiconductor layer having overlying the first P-type semiconductor layer. The second semiconductor layer is also P-type and is characterized by a lower conductivity than the first conductivity. A top metal layer overlies the second P-type semiconductor layer and forms a top contact to the device. In this vertical semiconductor device, a current conduction from the top metal layer to the bottom metal layer and through the second P-type semiconductor layer is characterized by a hole mobility along a <110> crystalline orientation and on (110) crystalline plane.

In a specific embodiment of the vertical semiconductor device, the first P-type semiconductor layer is characterized by a doping concentration of $1E17/cm^3$ or higher. In another embodiment, the first P-type semiconductor layer is characterized by a doping concentration higher than $6E19/cm^3$.

In a specific embodiment, the vertical semiconductor device includes a trench gate MOSFET which includes a trench extends into the second P-type semiconductor region. A gate dielectric layer lines sidewalls and bottom of the trench. The trench gate MOSFET includes a gate electrode over the gate dielectric in the trench and P-type source regions flanking each side of the gate electrode in the trench. The MOSFET also includes a P-type drift region, an n-type body region extending over the drift region, and P-type source regions in the body region adjacent to the trench.

In another embodiment, the vertical semiconductor device includes a shielded gate trench MOSFET which includes a trench extending into the second semiconductor layer. A shield dielectric lines sidewalls and a bottom surface of the trench. The shielded gate trench MOSFET includes a shield electrode in a lower portion of the trench and is insulated from the second semiconductor layer by the shield dielectric. An inter-electrode dielectric overlies the shield electrode, and a gate dielectric lines upper portions of trench sidewalls. The shielded gate trench MOSFET also includes a gate electrode in an upper portion of the trench over the inter-electrode dielectric. The gate electrode is insulated from the second semiconductor layer by the gate dielectric. In one embodiment, the second semiconductor layer includes a P-type drift region, an n-type body region extending over the drift region, and P-type source regions in the body region adjacent to the trench.

The following detailed description and the accompanying drawings provide a better understanding of the nature and advantage of the present invention.

DETAILED DESCRIPTION OF THE INVENTION

In accordance with embodiments of the invention, various techniques are described for forming vertical devices using P-type (110) oriented silicon material that provides increased hole mobility in current conduction on a (110) plane and in the <110> direction and heavily doped P-type regions for both reducing substrate resistance and forming a good ohm-contact. In one embodiment, a layer of heavily doped (110) silicon material is formed and then transferred to a support substrate. Following vertical device fabrication, the support substrate is replaced with a metal contact layer to the heavily doped (110) silicon material. In one variation of the invention, a layer of heavily doped (110) silicon material is formed on a lightly doped (110) silicon substrate. After device fabrication, the substrate is removed using a selective etching process after initial mechanical-grinding. Accordingly, embodiments of the invention combine higher hole mobility in the (110) P-type material and low resistivity of heavily doped (110) P-type material to improve device properties of P-type vertical semiconductor devices.

Depending upon the embodiment, the present invention includes various features, which may be used. These features include the following:
1. High mobility p-channel device is realized on the (110)/<110> crystallographicaly configured silicon wafer to achieve the high hole mobility in the inversion layer;
2. The contribution of the lightly doped (110) silicon substrate to device on-resistance is reduced; and
3. A (110) oriented silicon-on-metal (SOM) structure allows to substantially improve Rdson without increasing gate charge at the vertical power trench devices.

The above features may be in one or more of the embodiments to follow. These features are merely examples, which should not unduly limit the scope of the claims herein. One of ordinary skill in the art would recognize many variations, modifications, and alternatives.

Figure 1:
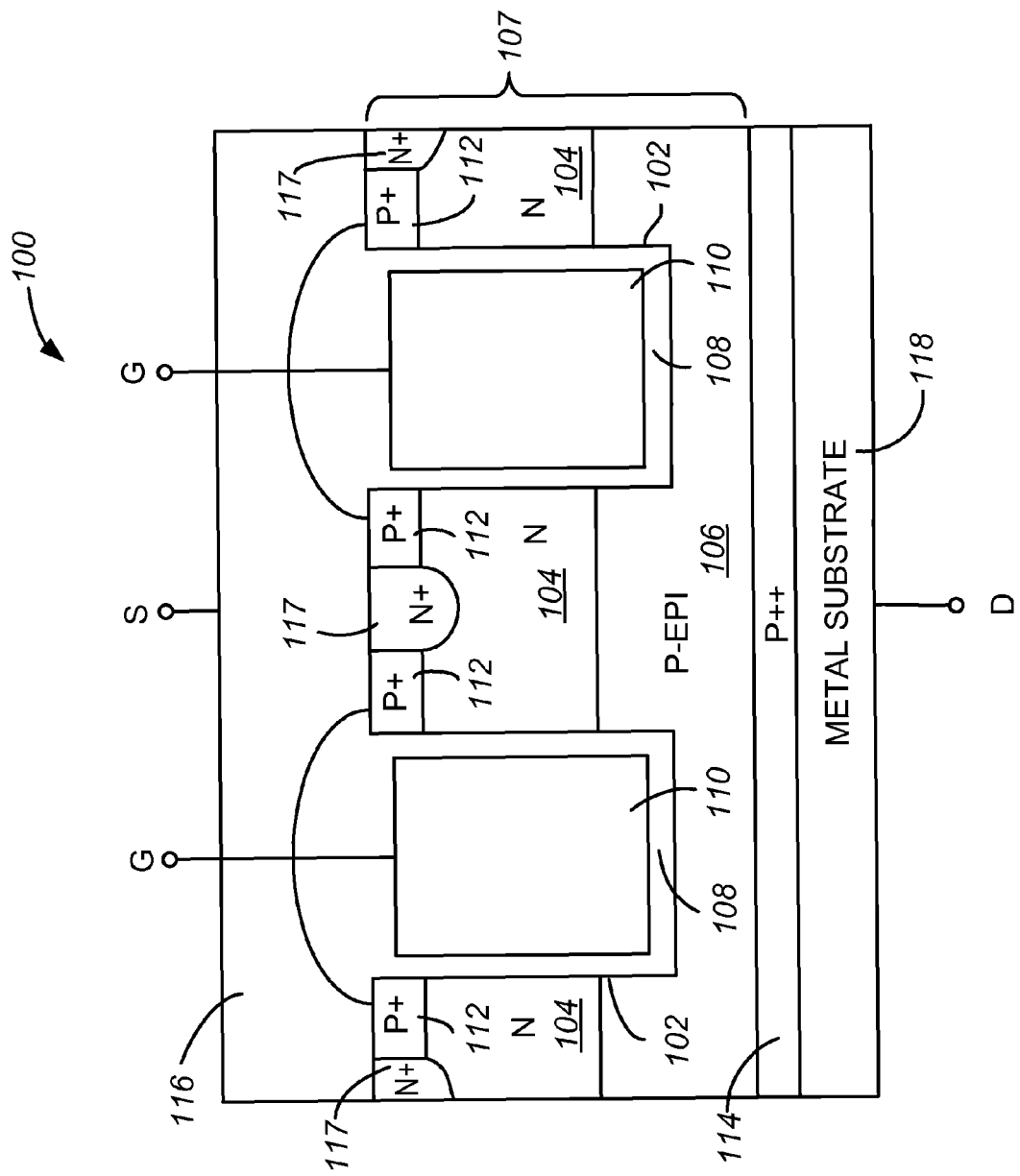
FIG. 1 is a simplified cross-sectional view diagram illustrating a P-type trench gate MOSFET in accordance with an embodiment of the invention.

FIG. 1 is a simplified cross-sectional view diagram illustrating a P-type trench gate MOSFET 100 in accordance with an embodiment of the invention. It is to be understood, however, that the principle techniques of the present invention apply to both discrete devices as well as integrated circuits using any processing technology. As with all other figures described herein, it is to be understood that the relative dimensions and sizes of various elements and components depicted in the figures do not exactly reflect actual dimensions and are for illustrative purposes only. As shown, MOSFET 100 includes gate electrodes G that are formed inside trenches 102. The trenches 102 extend from the top surface of an N– well body region 104 terminating in a P-type drift or epitaxial region 106. In one embodiment, the trenches 102 are lined with thin dielectric layers 108 and are substantially covered with conductive material 110, such as doped polysilicon. P-type source regions 112 are formed inside the N– well body region 104 adjacent trenches 102. MOSFET 100 includes a N+ body region 117 formed inside the N– well body region 104. MOSFET 100 includes a metal source layer 116. A drain terminal D for MOSFET 100 is coupled to a metal substrate 118 disposed on a P-type heavily doped silicon layer 114. The epitaxial layer 106 and body region 104 form a semiconductor structure layer 107 disposed on the heavily doped P-type silicon layer 114.

Figure 2:
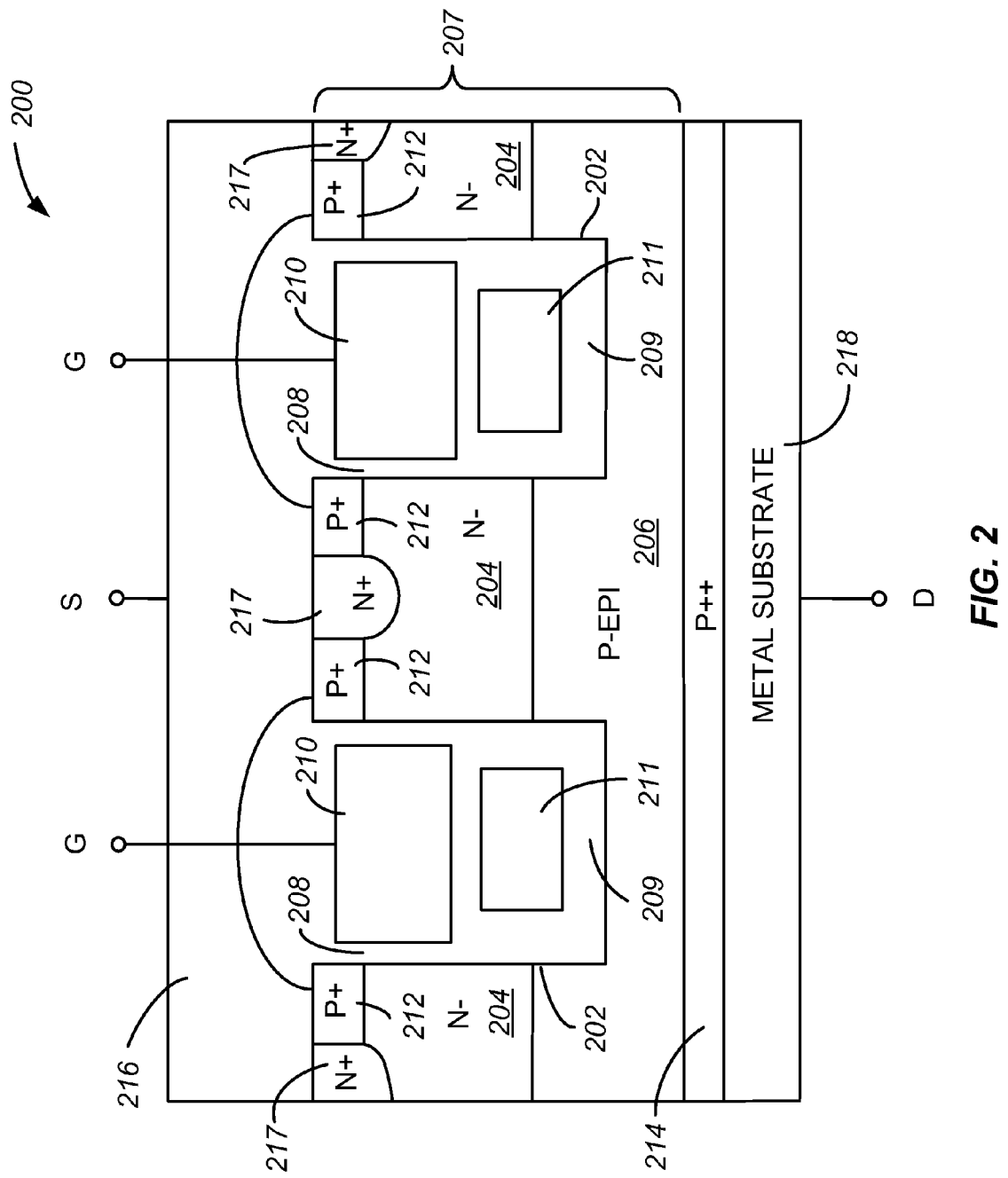
FIG. 2 is a simplified cross-sectional view diagram illustrating a P-type shielded gate trench MOSFET in accordance with another embodiment of the invention.

FIG. 2 is a simplified cross-sectional view diagram illustrating a P-type shielded gate trench MOSFET 200 in accordance with an embodiment of the invention. As shown, MOSFET 200 includes gate electrodes G that are formed inside trenches 202. The trenches 202 extend from the top surface of an N– well body region 204 terminating in a P-type drift or epitaxial region 206. In one embodiment, the upper portions of trenches 202 are lined with thin gate dielectric layers 208 and are substantially covered with conductive material 210, such as doped polysilicon, which form the gate electrodes G. Shielded gate electrodes 211, made of conductive material such as doped polysilicon, are insulated from lower portions of the trenches 202 with shield dielectric layers 209. P-type source regions 212 are formed inside the N– well body region 204 adjacent trenches 202. MOSFET 200 includes a N+ body region 217 formed inside the N– well body region 204. MOSFET 200 includes a metal source layer 216. A drain terminal D for MOSFET 200 is coupled to a metal substrate 218 disposed on a P-type heavily doped silicon layer 214. The epitaxial layer 206 and body region 204 form a semiconductor structure layer 207 disposed on the heavily doped P-type silicon layer 214.

A focus for trench MOSFET technology development is to reduce both on-resistance (Rdson) and gate charge, especially gate-to-drain charge ($Q_{gd}$). For example, Rdson can be reduced with increasing trench density by reducing pitch. This approach, however, often leads to higher $Q_{gd}$ simultaneously. It also can increase difficulty in contact formation for both the heavy body region and source region. This pitch miniaturization also can lead to higher leakage failure rate due to the defect generated by heavy body process.

According to one embodiment of the invention, a method is provided to fabricate p-channel trench MOSFET device on (110)-oriented silicon wafers with flat (notch) in crystallographic <110> direction to reduce the channel resistance. It is known that the hole mobility in the inversion layer can be more than doubled on silicon (110) plane in <110> direction ((110)/<110>) than on (100) plane in <100> direction ((100)/<100>). A relationship between hole mobility and channel resistance can be expressed in the following equation.

$$R_{ch} = \frac{L}{Z\mu_p C_{ox}(V_G - V_T)}$$

where L is the channel length, Z is the channel width, $C_{ox}$ is the gate oxide capacitance per unit area, $V_G$ is the gate voltage, $\mu_p$ is the hole mobility in channel region, and $V_T$ is the threshold voltage. The p-channel devices built on (110)/<110> crystallographicaly configured wafers thus have much reduced the $R_{ch}$ due to improved $\mu_p$.

Figure 3A:
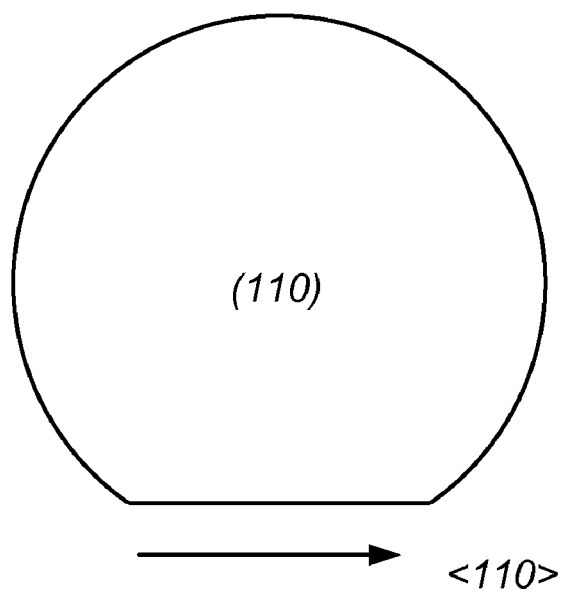
FIGS. 3A and 3B are simplified view diagrams illustrating crystalline orientations in a (110) wafer in accordance with embodiments of the invention.
Figure 3B:
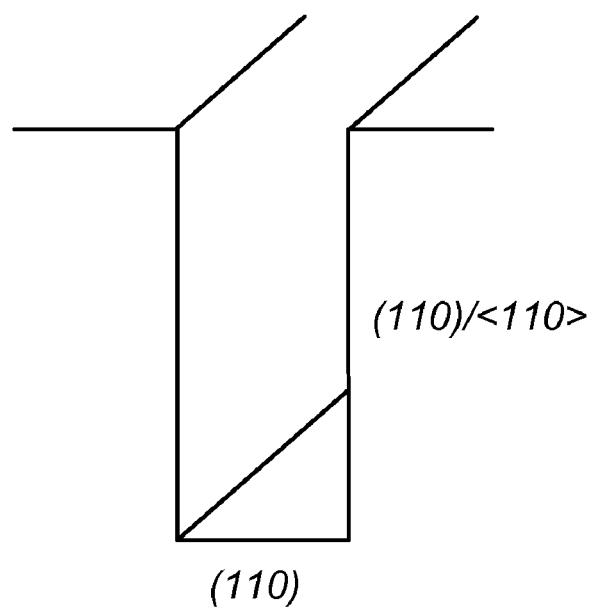

As shown in FIG. 3A, the (110)/<110> configuration can be realized by using (110)-oriented silicon wafers with flat (notch) parallel to the <110> crystallographic direction. As shown in FIG. 3B, the vertical trenches on this type of wafers have both trench bottom and side wall on (110) planes and the direction of current flow from the trench top to the trench bottom (channel direction) is in the <110> direction.

An obstacle in applying the (110)/<110> wafers for power trench MOSFET devices is growing heavily boron doped (110) oriented Czochralski (CZ) silicon wafers. Due to very small boron segregation coefficient on (110) oriented silicon crystal, boron incorporation is very limited. The resistivity of such ingot is in the range of tens Ω-cm. To build the vertical power trench device, it is necessary to have a heavily boron doped (110) oriented substrate and a technology to reduce the substrate contribution to the device on-resistance. According to one embodiment, the present invention provides a method for making p-channel trench MOSFET devices on a (110)-oriented silicon substrate with reduced the channel resistance. The invention also provides a method for reducing drain resistance with heavily doped (110)-oriented silicon substrate.

A process flow for forming a power device using a heavily doped P-type (110) substrate structure according to an exemplary embodiment of the invention is outlined next. An epi layer with a resistivity less than 100 mΩ-cm (dopant concentration $>1\times10^{17}$ cm$^{-3}$) and a thickness less than 3.0 µm is grown on the lightly doped (110) orientation silicon substrate. Then a thermal silicon dioxide layer with a thickness of 400~500 Å is grown on the top of the epi layer. Hydrogen ions/molecules are implanted through the silicon dioxide layer at a dose of $3\times10^{16}$ cm$^{-2}$ and energy of 60-170 KeV. For ease of reference, this wafer is called the seed wafer hereafter. The seed wafer is then bonded to another silicon wafer (support substrate) which is topped with a thermal silicon dioxide layer of 1000-2500 Å in thickness, using wafer direct bonding technique performed at room temperature. The bonded wafer pair is then subjected to the two-step low temperature annealing procedure. The first anneal at 150-300° C. for 10-20 hours is used for the fusion bond pre-strengthening, and the second anneal at 450° C. for 45 minutes serves for the separation of the heavily boron doped (110)-layer of the seed wafer along the cleaving plane defined by the hydrogen implantation energy. The thickness of the transferred heavily boron doped (110)-layer is defined therefore by the energy of the hydrogen implant and range from 0.5 to 1.5 µm in a specific embodiment. A more detailed description is now presented below.

Figure 4A:
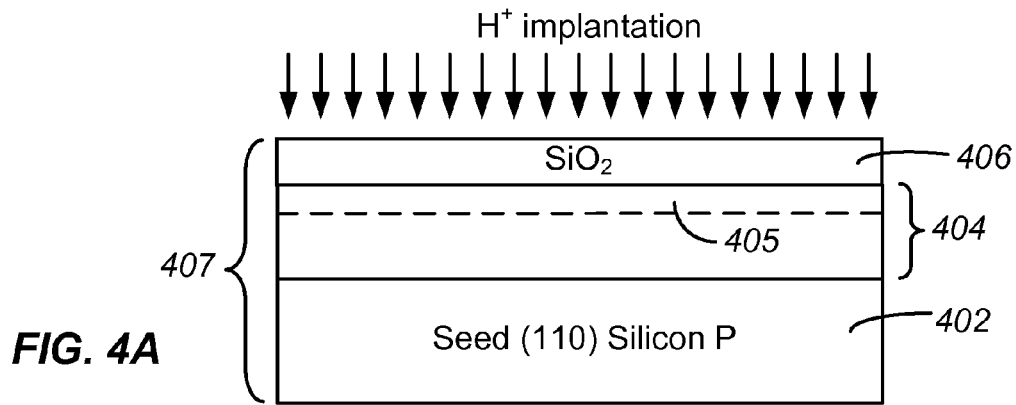
FIGS. 4A-4F are simplified cross-sectional view diagrams illustrating a simplified process flow for forming a heavily doped P-type (110) oriented substrate structure according to another embodiment of the present invention.

FIGS. 4A-4F are simplified cross-sectional view diagrams illustrating a process flow for forming a heavily doped P-type (110) substrate structure according to an embodiment of the present invention. FIG. 4A illustrates a cross-sectional view of a seed (110) silicon material 402, which may be doped by dopants such as Boron. In a specific example, silicon material 402 may be a lightly doped P-type silicon substrate. A heavily doped P-type epi layer 404 with a resistivity less than 100 mΩ-cm (dopant concentration $>1\times10^{17}$ cm$^{-3}$) and a thickness less than 3.0 µm is grown on the lightly doped (110) orientation silicon substrate. Alternatively, heavily doped layer 404 may be formed by implanting dopants in silicon material 402. Then a thermal silicon oxide layer 406 with a thickness of 400~500 Å is grown on the top of heavily doped layer 404. Hydrogen ions/molecules are implanted through the silicon dioxide layer at a dose of $3\times10^{16}$ cm$^{-2}$ and energy of 60-170 KeV. In one embodiment, the wafer including layers 402, 404, and 406 is referred to as the seed wafer 407 hereafter. In an embodiment, the hydrogen implant creates a hydrogen rich region 405 delineated as the dotted line in the epi layer 404. An exemplary process for doping hydrogen ions into a silicon substrate is disclosed in U.S. Pat. No. 5,374,564, by Bruel, incorporated herein by reference in its entirety.

In one embodiment, the concentration of hydrogen ions is provided at a sufficient depth and energy potential to form a hydrogen rich region, or cleavable region, 405, having an exemplary thickness of between about 1-2 µm. Because of hydrogen embrittlement, the cleavable region 405 lattice is weaker than non-hydrogen doped silicon lattice.

Figure 4B:
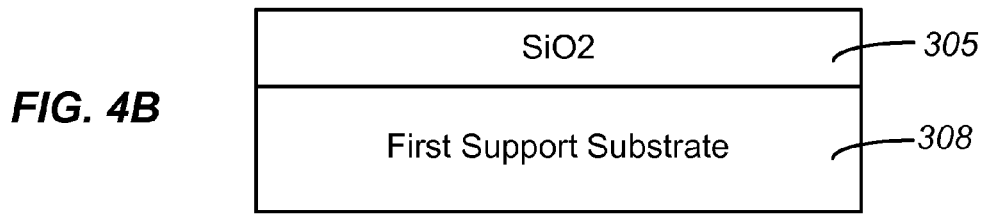

FIG. 4B illustrates a cross-sectional view of one embodiment of a first support substrate 308 accordance with embodiments of the invention. In one embodiment, the first support substrate 308 is a (100) silicon substrate. In another embodiment, the (100) silicon substrate is covered by a silicon dioxide ($SiO_2$) layer 305. The $SiO_2$ layer 305 is used as an etch stop layer and may be virtually any thickness that may be used to advantage. For example, in one embodiment, the $SiO_2$ layer 305 may be about between 1000 and 2500 Å. In another embodiment, the $SiO_2$ layer 305 may be about between 2500 and 4000 Å. The $SiO_2$ layer 305 may be grown or deposited on the support substrate 308 using virtually any $SiO_2$ layer formation process. For example, the $SiO_2$ layer 305 may be grown using a thermal oxidation process.

Figure 4C:
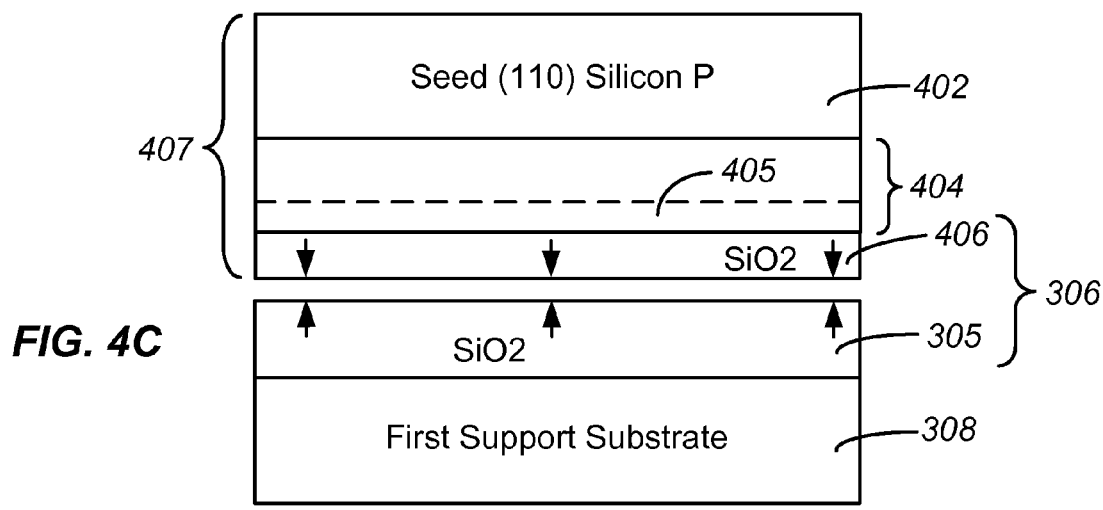

In FIG. 4C the first support substrate 308 and oxide layer 305 is bonded to seed wafer 407 including layers 402, 404, and 406 as shown in FIG. 4A. In a specific embodiment, oxide layers 305 and 406 are bonded together in the bonding process to form oxide layer 306. The bonding can be carried out using any of a number of bonding techniques. For example, after a wet chemical and de-ionized (DI) water treatment to render the $SiO_2$ layers 305 and 406 with a hydrophilic surface, the $SiO_2$ layer 305 and the seed wafer 407 may be bonded at room temperature using conventional bonding techniques.

Figure 4D:
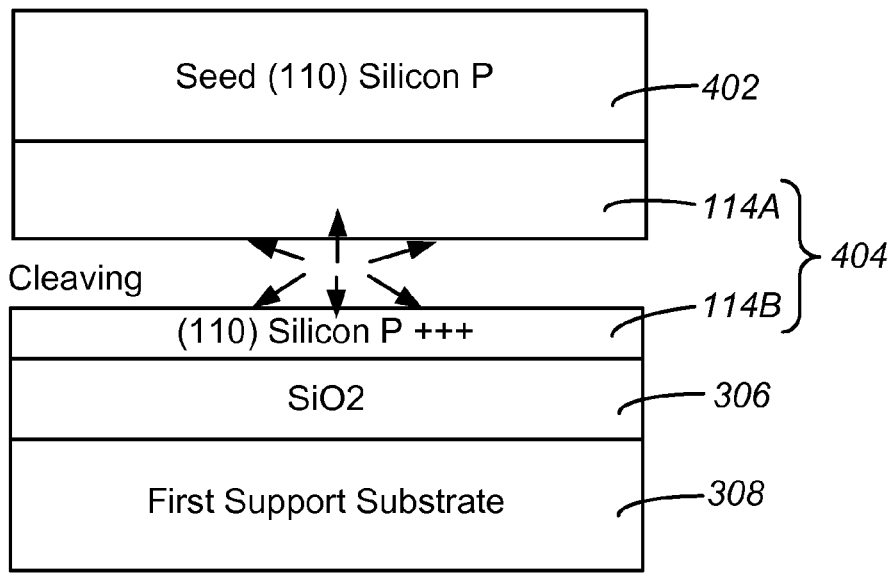

In FIG. 4D a cleaving process is performed to divide the epi layer 404 into two separate layers 114A and 114B. The cleaving process leaves a lower layer 114B of heavily doped (110) P-type silicon on the first support substrate 308 and a remaining layer portion 114A of the epi layer on the seed silicon material 402. The cleaving may be carried out using any number of cleaving processes to break the lattice structure of the cleavable region 405. In one embodiment, the cleaving process includes annealing the seed wafer 407 and the initial substrate 308 at a temperature of between 150 and 300° C. for about 5 hours to 10 hours. In another embodiment the cleaving process includes annealing the seed wafer 407 and the first support substrate 308 at a temperature of about 450° C. for about 15 minutes. In a specific embodiment, the bonded wafer pair is subjected to a two-step low temperature annealing procedure. The first anneal at 150-300° C. for 10-20 hours is used for the fusion bond pre-strengthening, and the second anneal at 450° C. for 45 minutes serves for the separation of the heavily boron doped (110)-layer of the seed wafer along the cleaving plane defined by the hydrogen implantation energy. The thickness of the transferred heavily boron doped (110)-layer is defined therefore by energy of the hydrogen implant and range from 0.5 to 1.5 μm in a specific embodiment.

Figure 4E:
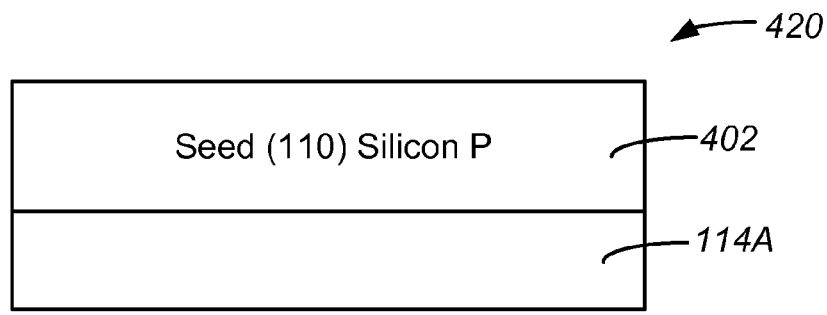
Figure 4F:
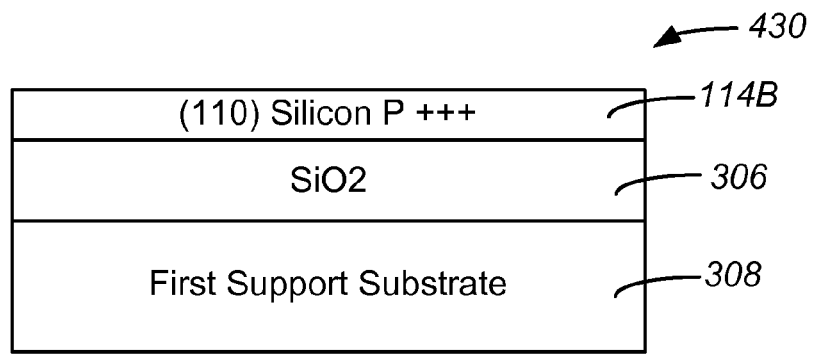

FIGS. 4E and 4F are simplified cross-sectional view diagrams illustrating the two parts formed in the cleaving process described in FIG. 4D. In FIG. 4E a composite material 420 is formed which includes lightly doped P-type (110) silicon wafer 402 and a heavily P-type doped (110) epi layer 114A. In one embodiment, composite material 420 can be used to form another seed wafer, such as seed wafer 407 in FIG. 4A, and used repeatedly in a process as described in FIGS. 4A-4D. FIG. 4F shows a composite material 430, which includes heavily doped P-type (110) layer 114B overlying an oxide layer now labeled 306 which overlies the first support substrate 308. In one embodiment layer 114B has a resistivity of 8 mΩ-cm, which is much lower than that of commercially available (110) silicon wafers. In one embodiment this layer is used in forming a vertical device and provides a good ohm contact for backside meta layer. An example of a method for forming a vertical device is discussed below.

Figure 5A:
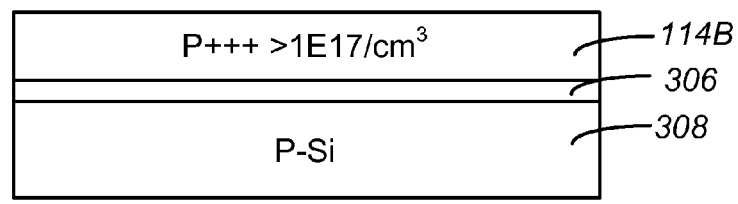
FIGS. 5A-5H are simplified cross-sectional view diagrams illustrating a process flow for forming a vertical device using a heavily doped P-type (110) oriented substrate according to an embodiment of the present invention.

FIGS. 5A-5H are simplified cross-sectional view diagrams illustrating a process flow for forming a vertical device using a heavily doped P-type (110) oriented substrate according to an embodiment of the present invention. FIG. 5A illustrates a cross-sectional view of one embodiment of the semiconductor process structure 430 of FIG. 4F with heavily doped P-type (110) silicon layer 114B over an oxide layer 306 which in turn overlies support layer 308. In one example, support layer 308 may be a lightly doped (100) silicon layer. In a specific embodiment, layer 114B has a doping concentration of $1E17/cm^3$ or higher. In one embodiment, the structure in FIG. 5A may be formed using a process described in FIGS. 4A-4F. Alternatively, the structure in FIG. 5A may be formed using another method.

Figure 5B:
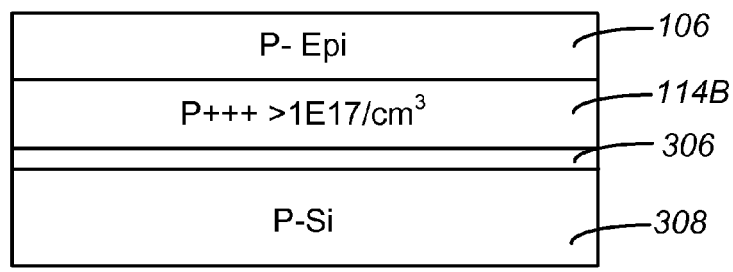

In FIG. 5B, a lightly doped P-type (110) epitaxial layer 106 is formed on the doped P-type (110) silicon layer 114B. Optionally, the cleaved doped silicon layer 114B may be pretreated in a CVD chamber to prepare the silicon layer 114B for the epitaxial layer 106 formation. The pretreatment may be used to generate a more uniform surface.

Figure 5C:
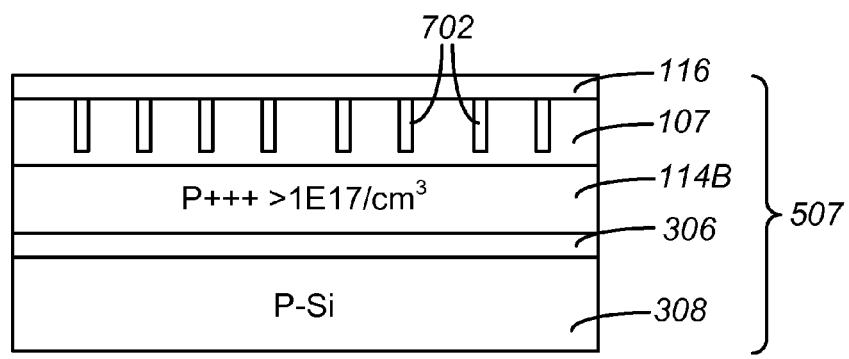

In FIG. 5C, semiconductor devices 702 are formed in and over epitaxial layer 106 and form semiconductor structure layer 107. The formation of the semiconductor structure layer 107 may be done by any conventional semiconductor structure formation techniques. For example, the semiconductor structures 702 may be formed on and/or within the epitaxial layer 106 using conventional semiconductor structure fabrication steps such as layering, patterning, and doping. The semiconductor structures 702 may also be formed on and/or formed integral to the doped silicon layer 114B. In one example, semiconductor structure layer 107 may include trench gate MOSFET structures as discussed above in connection with FIG. 1. In this example, each semiconductor structures 702 is a trench gate MOSFET. In another example, semiconductor structure layer 107 in FIG. 5C may include shielded gate trench MOSFET structures as discussed above in connection with FIG. 2. In this example, each semiconductor structures 702 is a shielded gate trench MOSFET. In one optional operational configuration, for MOSFETs, for example, the metal layer 116 is formed on the semiconductor structures 702. The metal layer 116 may be applied using virtually any process some of which are described herein. In another embodiment, after the formation of the device layer 107, the initial substrate 308, $SiO_2$ layer 306, doped silicon layer 114B, and semiconductor structure layer 107 together form another intermediate semiconductor processing structure 507.

Figure 5D:
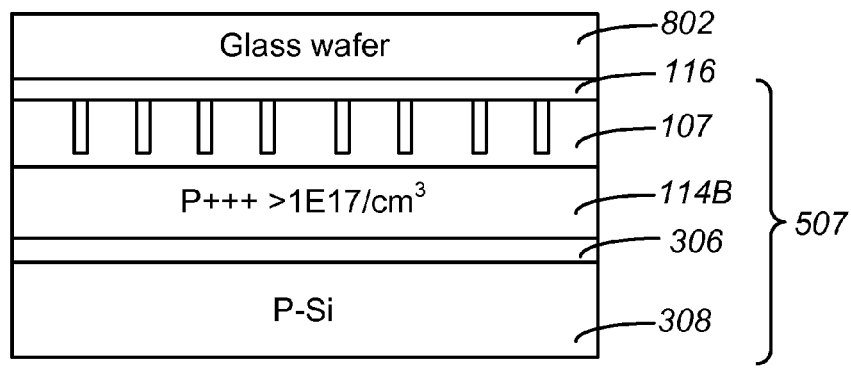

In FIG. 5D a second support substrate 802, for example, a glass wafer, is mounted to metal layer 116 over the semiconductor structure layer 107 to support the semiconductor process structure 507 for processing. For example, second support substrate 802 is mounted to the semiconductor process structures 507 using a UV releasable double sided tape, which provides an adhesive bond sufficient in strength to securely hold the intermediate semiconductor process structure for processing.

Figure 5E:
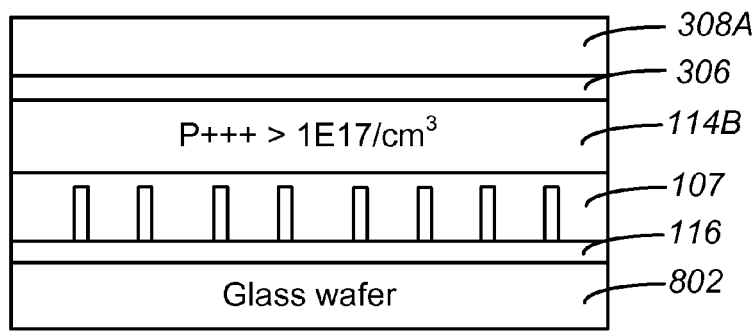

In FIG. 5E, the initial support layer 308, for example, a (100) silicon substrate, is thinned by a substrate thinning process. Optionally, in one embodiment, the initial substrate 308 is thinned using a mechanical thinning process such as mechanical polishing/grinding to form a thinner substrate 308A. The initial substrate 308 may be thinned, e.g., to about 8 mils to make it faster to remove with chemicals.

Figure 5F:
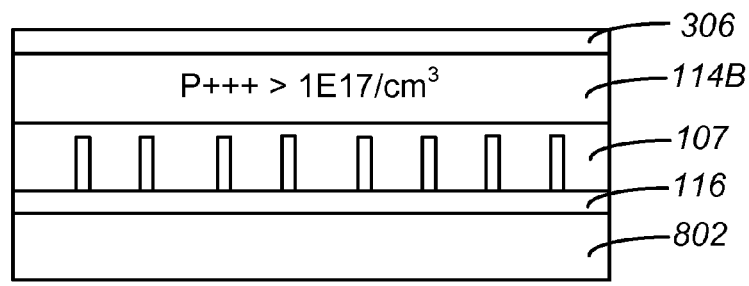

In FIG. 5F the remaining substrate 308A is removed using a substrate etching process. In one process, the substrate 308A is removed by chemically etching the substrate 308A with a chemical etching process using the buried $SiO_2$ layer 306 as an etch stop layer. As the $SiO_2$ layer 306 is configured to stop the chemical etching process, silicon layer 114B and the semiconductor structure layer 107 remain untouched by the chemical used to etch the initial substrate 308A. The chemical etching may be done by any process to remove the initial substrate 308A. For example, the etching process may be done with chemicals such as acid, hydroxides, and the like, that remove the initial substrate 308A, but do not etch the buried $SiO_2$ layer 306. In one process, the chemical etching process to remove the initial substrate 308A may be illustrated with the following chemical formula:

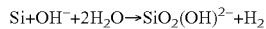

$$Si + OH^- + 2H_2O \rightarrow SiO_2(OH)^{2-} + H_2$$

Where $SiO_2(OH)^{2-}$ is a soluble complex.

Figure 5G:
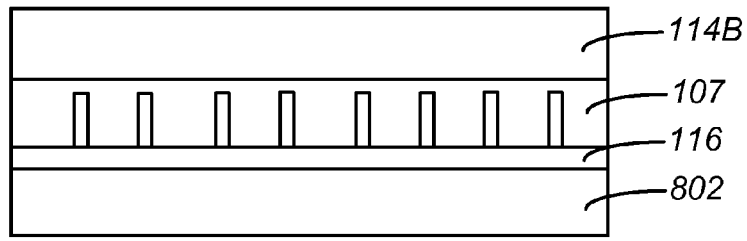

In FIG. 5G the $SiO_2$ layer 306 is removed by an etching process. The buried $SiO_2$ layer 306 may be chemically etched using a solution of HF. In this configuration, the heavily doped (110) silicon layer 114B is used as the etch stop. For example, the $SiO_2$ layer 306 may be etched with a 49 wt % HF solution at room temperature. This particular solution may etch the $SiO_2$ layer 306 at about 2.5 μm/min. The etching process for removing layer 306 can be illustrated with the following chemical equation:

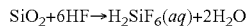

$$SiO_2 + 6HF \rightarrow H_2SiF_6(aq) + 2H_2O$$

Figure 5H:
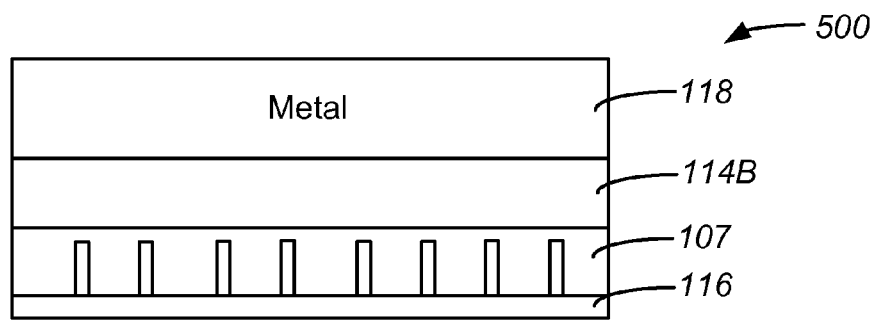

In FIG. 5H a metal substrate 118 is formed on the doped silicon layer 1114B. In one embodiment, the metal substrate 118 may be formed using virtually any process, such as electroplating and/or using deposition processes such as plasma vapor deposition (PVD), chemical vapor deposition (CVD), and the like. In another example, the metal substrate 118 may be electroplated on the doped silicon layer 114B. The metal substrate 118 may include virtually any metal or conductor that may be used to advantage such as copper, aluminum, or alloys such as solder, and the like.

In FIG. 5H, support layer 802 is removed. The support layer 802 may be removed using any number of techniques. For example, the support layer 802 may be removed using an ultra violet light process where the bonding tape is configured to release when exposed to a sufficient amount of UV light for a predetermined duration. Subsequently, the semiconductor process structure 500 in FIG. 5H may be diced into individual devices (dies) in accordance with embodiments of the invention.

As discussed above in connection with FIGS. 4A-4F and FIGS. 5A-5H, the present invention provides a method for fabricating p-channel trench MOSFET device on (110)-oriented silicon material to facilitate hole current conduction in the <110> direction to reduce channel resistance. In a specific embodiment, the vertical trenches on this type of wafers have both trench bottom and side wall on (110) planes and the direction of current flow from the trench top to the trench bottom (channel direction) is in the <110> direction. The method can be used to form a vertical device, such as trench gate MOSFET or shielded gate trench MOSFET, in which a current conduction in the vertical direction is enhanced. For example, in FIG. 5H a current may be conducted between metal layers 116 and 118 and through device layer 107, where device layer 107 may include a trench gate MOSFET or a shielded gate trench MOSFET. In alternative embodiment, device layer 107 may also include other vertical devices such as diodes or IGBTs.

Figure 6:
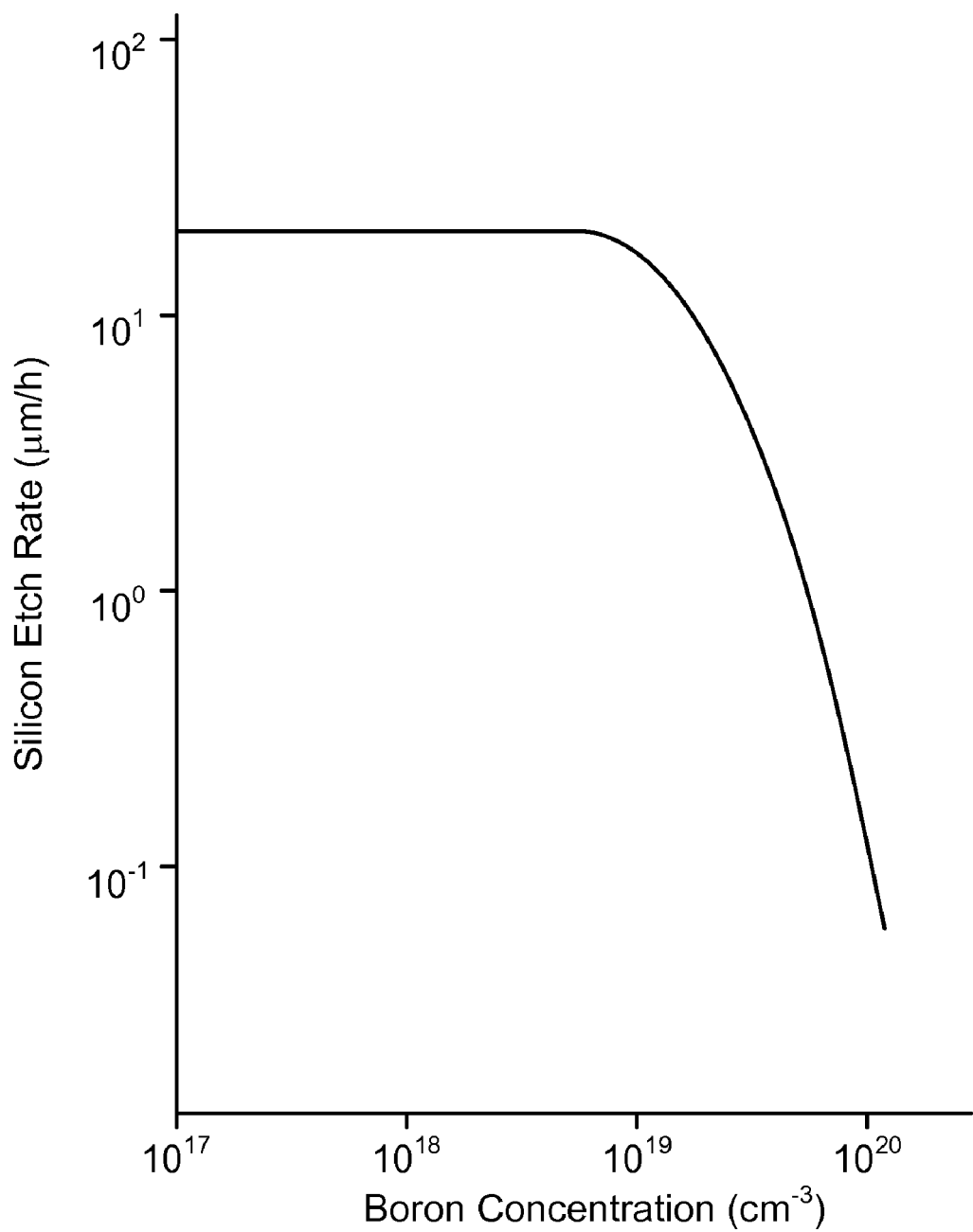
FIG. 6 is a simplified diagram illustrating variations in silicon etch rate as a function of boron concentration according to an embodiment of the present invention.

FIG. 6 is a simplified diagram illustrating a relationship between etch rate of a silicon substrate and its boron concentration according to an embodiment of the present invention. This diagram is merely an example, which should not unduly limit the scope of the claims herein. One of ordinary skill in the art would recognize other variations, modifications, and alternatives. As shown, the etch rate of silicon decreases sharply as its boron concentration is increased above about $1 \times 10^{19}$ $cm^{-3}$. Specifically there is significant etching rate difference between heavily and lightly boron doped silicon substrates with either KOH or ehtylenediamine/pytocatechol/water (EDP). For example, in EDP solution at 81° C., the etching rate at boron concentration $<1 \times 10^{19}$ $cm^{-3}$ is about 20 μm/hr, compared to that of 0.1 μm/hr at the boron concentration of $1 \times 10^{20}$ $cm^{-3}$. The etching rate difference can be as large as 200 times. A similar etching rate difference has been observed in KOH chemistry as well. This etching difference will enable the heavily boron doped silicon layer as etching stop. This etch selectivity between lightly doped P-type silicon and heavily doped P-type silicon is used advantageously in a method in an embodiment of the present invention.

Figure 7A:
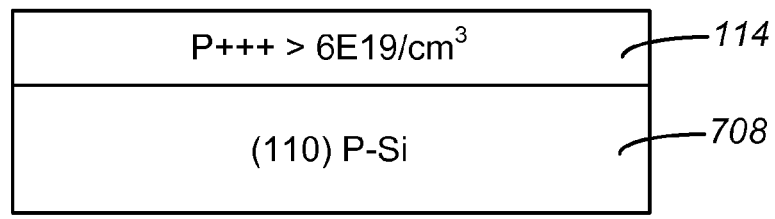
FIGS. 7A-7G are simplified cross-sectional view diagrams illustrating another process flow for forming a vertical device using a heavily doped P-type (110) oriented substrate according to an alternative embodiment of the present invention.
Figure 7B:
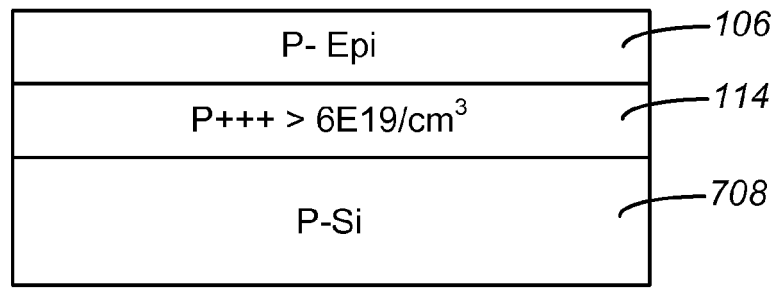
Figure 7C:
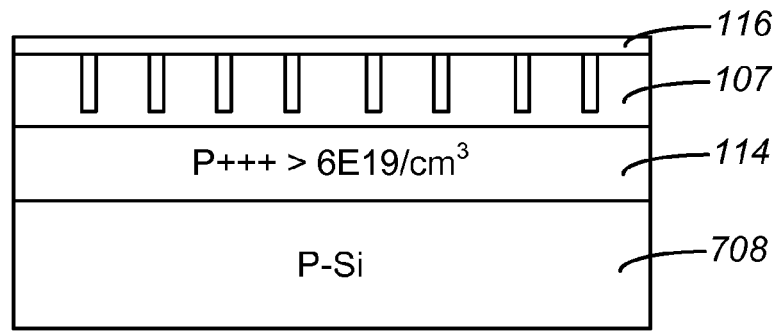
Figure 7D:
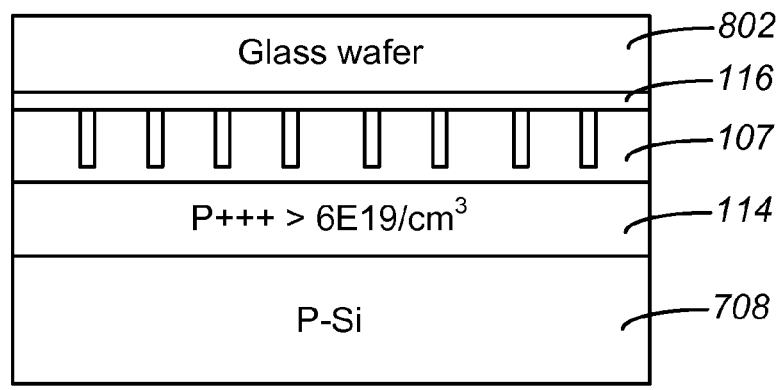

FIGS. 7A-7G are simplified cross-sectional view diagrams illustrating another process flow for forming a vertical device using a heavily doped P-type (110) oriented substrate according to an alternative embodiment of the present invention. First, in FIG. 7A, a heavily boron doped (110) layer 114 (with concentration $>6 \times 10^{19}$ $cm^{-3}$) is epitaxially grown or formed through boron implant on (110) oriented silicon wafer 708. Merely as an example, an epi process can be carried out at 1060° C. with a $B_2H_6$ doping species (mixing with $H_2$ at a concentration of 5000 ppm). Alternatively, heavily doped layer 114 may be formed by boron ion implantation. The implant can be of 60 KeV with a dose of $1 \times 10^{16}$ $cm^{-2}$ for half an hour to create a heavily doped silicon layer. After this process, the desired device epi layer 106 is grown as shown in FIG. 7B. The wafer then undergoes the device fabrication process to build the device. In FIG. 7C device layer 107 and metal layer 116 are formed, which may include trench gate MOSFET or shielded gate trench MOSFET, or other vertical devices, such as described in FIGS. 5A-5H. The finished wafer is then bonded to a support substrate 802, e.g., a glass carrier as shown in FIG. 7D, and ready for substrate transfer.

Figure 7E:
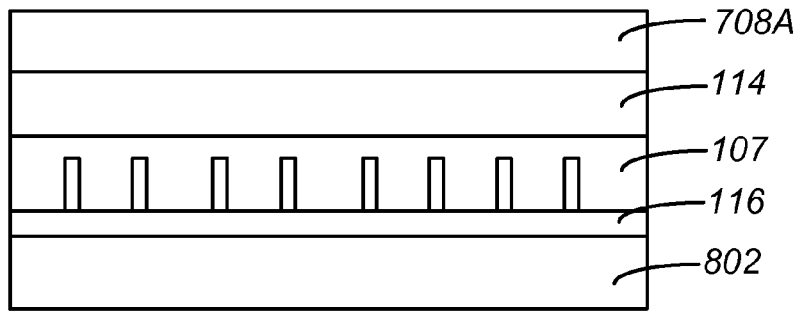
Figure 7F:
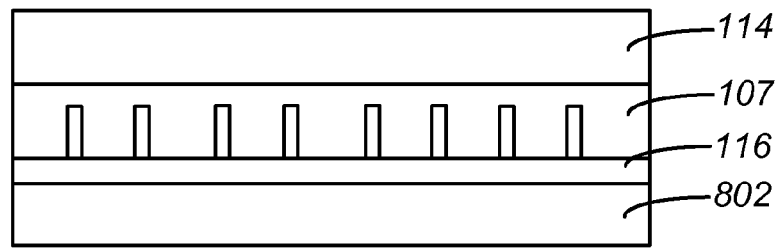
Figure 7G:
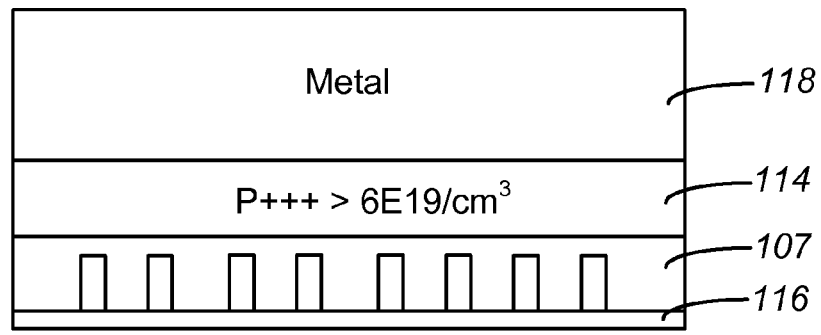

In FIG. 7E, the majority (e.g. 90%) of support substrate silicon wafer 708 is removed through mechanical grinding and acid etching until certain thickness of lightly doped (110) oriented silicon wafer 708A is left, such as 5 μm. The final 5 μm thick silicon 708A is removed by EDP or KOH. Due to the high selectivity of the EDP/KOH etching, the silicon etching will stop at the heavily doped boron silicon 114. In FIG. 7F, this wafer is then ready for the backside metal deposition 118 and supporting metal transferring by removing the glass substrate 802, resulting in the device structure shown in FIG. 7G. The method include certain processes, such as vertical device fabrication, support layer bonding, metal deposition, etc, similar to corresponding processes described above in connection with FIGS. 5A-5H.

Thus FIGS. 7A-7G are simplified diagrams illustrating an alternative method for forming vertical devices in (110) P-type silicon for enhanced hole mobility which also provides heavily-doped (110) P-type drain regions and metal layers for reducing resistance. As shown, the process is simplified by etch selectivity between heavily doped P-type silicon and lightly doped P-type silicon.

Another challenge in applying the (110)/<110> configured wafers for power trench MOSFET devices is forming high quality gate oxide on (110) plane. An issue is to reduce both fixed oxide charge and interface trap density ($D_{it}$) to achieve acceptable threshold voltage and threshold voltage stability. It has been established that the $D_{it}$ is proportional to the density of available bonds on the surface. Table 1 summarizes the silicon properties of different crystallographic planes. The $D_{it}$s at (100) and at (111) planes are of $2 \times 10^{10}$ and of $2 \times 10^{11}$ 1/$cm^2$-eV, respectively. The fact that available bonds per unit area on the (110) plane are between (100) and (111) planes indicates that the $D_{it}$ of (110) plane will be between $2 \times 10^{10}$ and $2 \times 10^{11}$ 1/$cm^2$-eV although no data is available. According to embodiments of the invention, reducing oxide growth rate and adding additional hydrogen annealing can further reduce the $D_{it}$ and fixed oxide charge and improve gate oxide integrity.

TABLE 1

Physical properties of Silicon

| Orientation | Surface Density 1/cm$^2$ | Available Bonds 1/cm$^2$ | $D_{it}$ at mid-gap 1/cm$^2$-eV |
|---|---|---|---|
| (100) | 6.8 × 10$^{14}$ | 6.8 × 10$^{14}$ | 2 × 10$^{10}$ |
| (110) | 9.6 × 10$^{14}$ | 9.6 × 10$^{14}$ | |
| (111) | 7.85 × 10$^{14}$ | 11.8 × 10$^{14}$ | 2 × 10$^{11}$ |

While the above is a complete description of specific embodiments of the present invention, various modifications, variations, and alternatives may be employed. For example, while the invention is illustrated using vertical MOSFETs, the invention could easily be applied to other structures such as trench gate IGBTs by merely reversing the polarity of the substrate from those shown in FIGS. 1 and 2. Further, the invention is not limited to trench gate structures and may be used in forming other devices such as planar gate vertical MOSFETs, planar gate vertical IGBTs, diodes, and various types of thyristors. Hence, the scope of this invention should not be limited to the embodiments described, but are instead defined by the following claims.

What is claimed is:

1. A method of forming a semiconductor device on a heavily doped P-type (110) semiconductor layer over a metal substrate, the method comprising:
   providing a first P-type semiconductor layer, the first P-type semiconductor layer being characterized by a surface crystal orientation of (110) and a first conductivity, the first P-type semiconductor layer being heavily doped;
   forming a second P-type semiconductor layer overlying the first P-type semiconductor layer, the second P-type semiconductor layer having a surface crystal orientation of (110) and being characterized by a lower conductivity than the first conductivity;
   forming a top conductor layer overlying the second P-type semiconductor layer; and
   forming a bottom conductor layer underlying the first P-type semiconductor layer,
   wherein a current conduction from the top conductor layer to the bottom conductor layer and through the second p-type semiconductor layer is characterized by a hole mobility along a <110> crystalline orientation and on a (110) crystalline plane.

2. The method of claim 1 wherein providing a first P-type semiconductor layer includes providing a first support substrate, and forming a P-type heavily doped (110) silicon layer overlying the first support substrate, at least a top layer of the first support substrate being removable by a selective etching process with respect to the P-type heavily doped (110) silicon layer.

3. The method of claim 2 wherein the first support substrate comprises an oxide layer overlying a silicon substrate.

4. The method of claim 3 wherein forming the P-type heavily doped (110) silicon layer comprises:
   providing a first silicon substrate, the first silicon substrate being characterized by (110) crystalline orientation, P-type conductivity, and light doping;
   forming a P-type heavily doped (110) silicon layer overlying the first silicon substrate;
   forming a first oxide layer overlying the P-type heavily doped (110) silicon layer;
   implanting hydrogen ions into the heavily doped (110) silicon layer to form a region therein sufficiently weakened by the hydrogen to allow cleaving the heavily doped (110) silicon layer along the region to form an upper (110) layer and a lower (110) layer;
   bonding the first substrate to the first support substrate; and
   cleaving the P-type heavily doped (110) silicon layer along the region leaving the lower (110) layer bonded to the second silicon dioxide layer overlying the support substrate.

5. The method of claim 3 wherein the removing of the first support substrate comprises:
   grinding the silicon substrate;
   etching the remaining silicon substrate using the oxide layer as an etch stop; and
   etching the oxide layer using the P-type heavily doped (110) silicon layer as an etch stop.

6. The method of claim 2 wherein the first support substrate comprises a silicon substrate characterized by (110) crystalline orientation, P-type conductivity, and light doping.

7. The method of claim 6 wherein forming the P-type heavily doped (110) silicon layer comprises using an epitaxial process including in-situ doping.

8. The method of claim 6 wherein forming the P-type heavily doped (110) silicon layer including using an ion implantation process.

9. The method of claim 6 wherein removing the first support substrate comprises etching the silicon substrate using the heavily doped P-type silicon layer as an etch stop.

10. The method of claim 6 wherein removing the first support substrate comprises removing the silicon substrate using a wet etching process including KOH or EDP.

11. The method of claim 2 further comprising:
    forming a vertical semiconductor device structure in and over the P-type heavily doped (110) silicon layer and the second P-type semiconductor layer, the vertical semiconductor device structure being characterized by a current conduction in a (110) plane and in a <110> direction;
    bonding a second support substrate to the top metal layer; and
    removing the first support substrate to expose a surface of the P-type heavily doped (110) silicon layer, at least the top layer in the first support substrate being removed using a selective etching process with respect to the P-type heavily doped (110) silicon layer.

12. The method of claim 11 wherein forming the vertical semiconductor device structure comprises forming a lightly doped (110) epitaxial layer on P-type heavily doped (110) silicon layer and forming a trench structure in and over the epitaxial layer.

* * * * *